United States Patent [19]
Erjavic et al.

[11] Patent Number: 5,477,138
[45] Date of Patent: Dec. 19, 1995

[54] APPARATUS AND METHOD FOR TESTING THE CALIBRATION OF A VARIETY OF ELECTRONIC PACKAGE LEAD INSPECTION SYSTEMS

[75] Inventors: Scott A. Erjavic, Danville; Steven H. C. Hsieh, San Francisco, both of Calif.

[73] Assignee: VLSI Technology, Inc., San Jose, Calif.

[21] Appl. No.: 13,861

[22] Filed: Feb. 5, 1993

Related U.S. Application Data

[63] Continuation-in-part of Ser. No. 734,658, Jul. 23, 1991.
[51] Int. Cl.$^6$ .................................................... G01R 31/02
[52] U.S. Cl. ........................................ 324/158.1; 324/765
[58] Field of Search ............................ 324/158 R, 158 F, 324/158 T, 158.1, 537, 765

[56] References Cited

PUBLICATIONS

Dana Design Brochure; Golden Units for Accuracy and Performance Verification; Feb. 12, 1992; p. 1.

*Primary Examiner*—Ernest F. Karlsen
*Attorney, Agent, or Firm*—Majestic, Parson, Siebert and Hsue

[57] ABSTRACT

A universal verification unit resembling certain aspects of an electronic package is used for testing the proper calibration of different lead inspection systems. Comparison of readings provided by the system when the unit is inspected to actual values will indicate whether the system is properly calibrated.

14 Claims, 15 Drawing Sheets

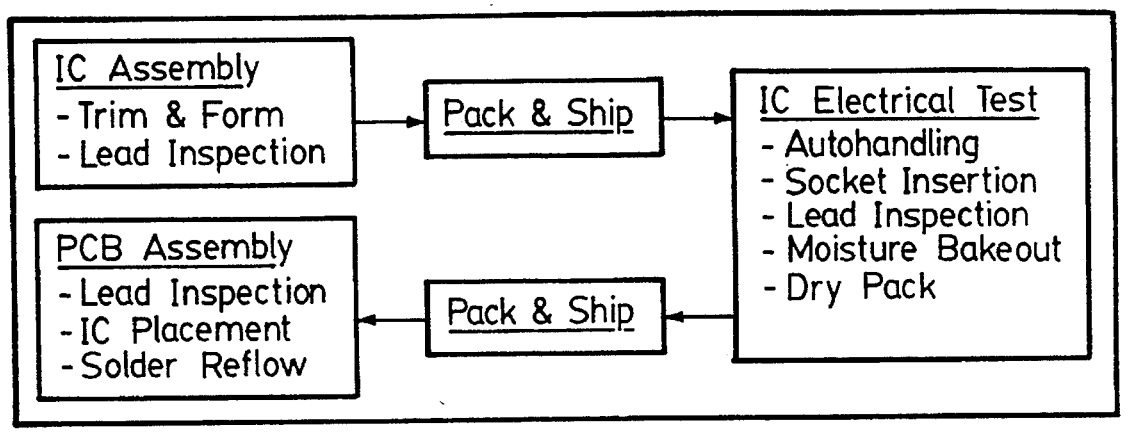
FIG._1.
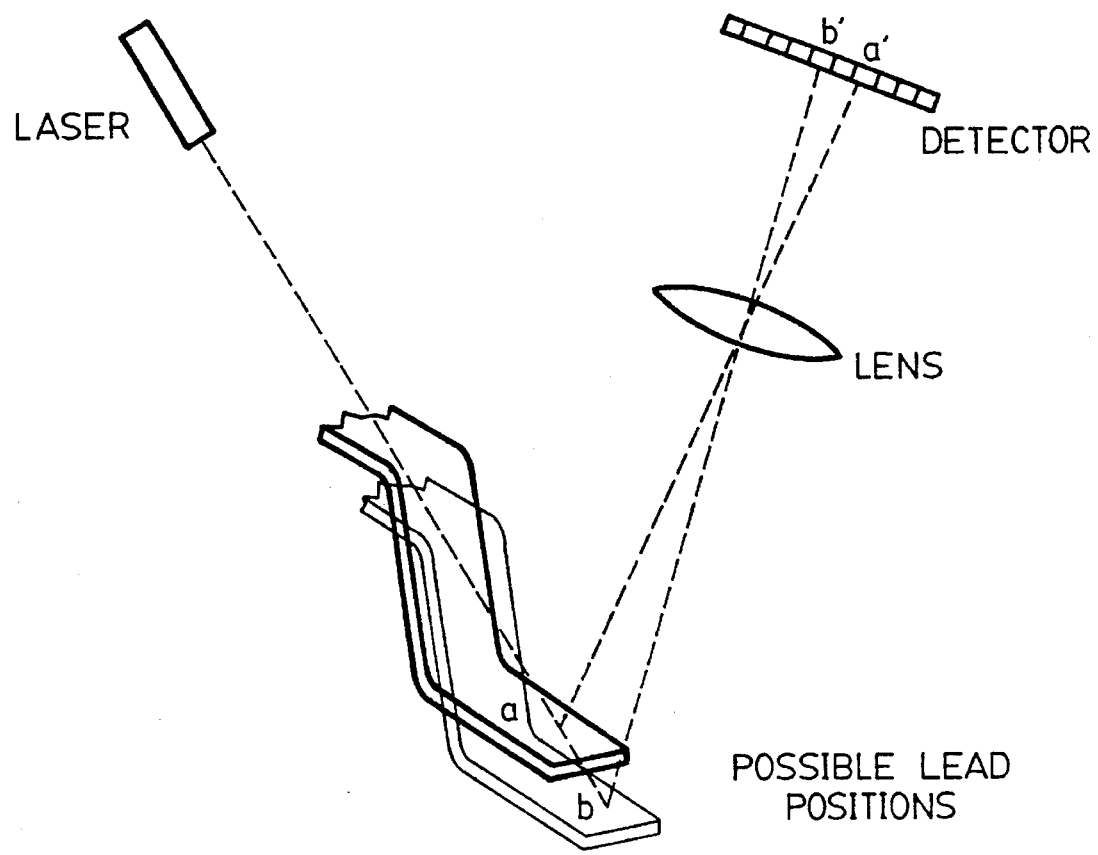
FIG._2.

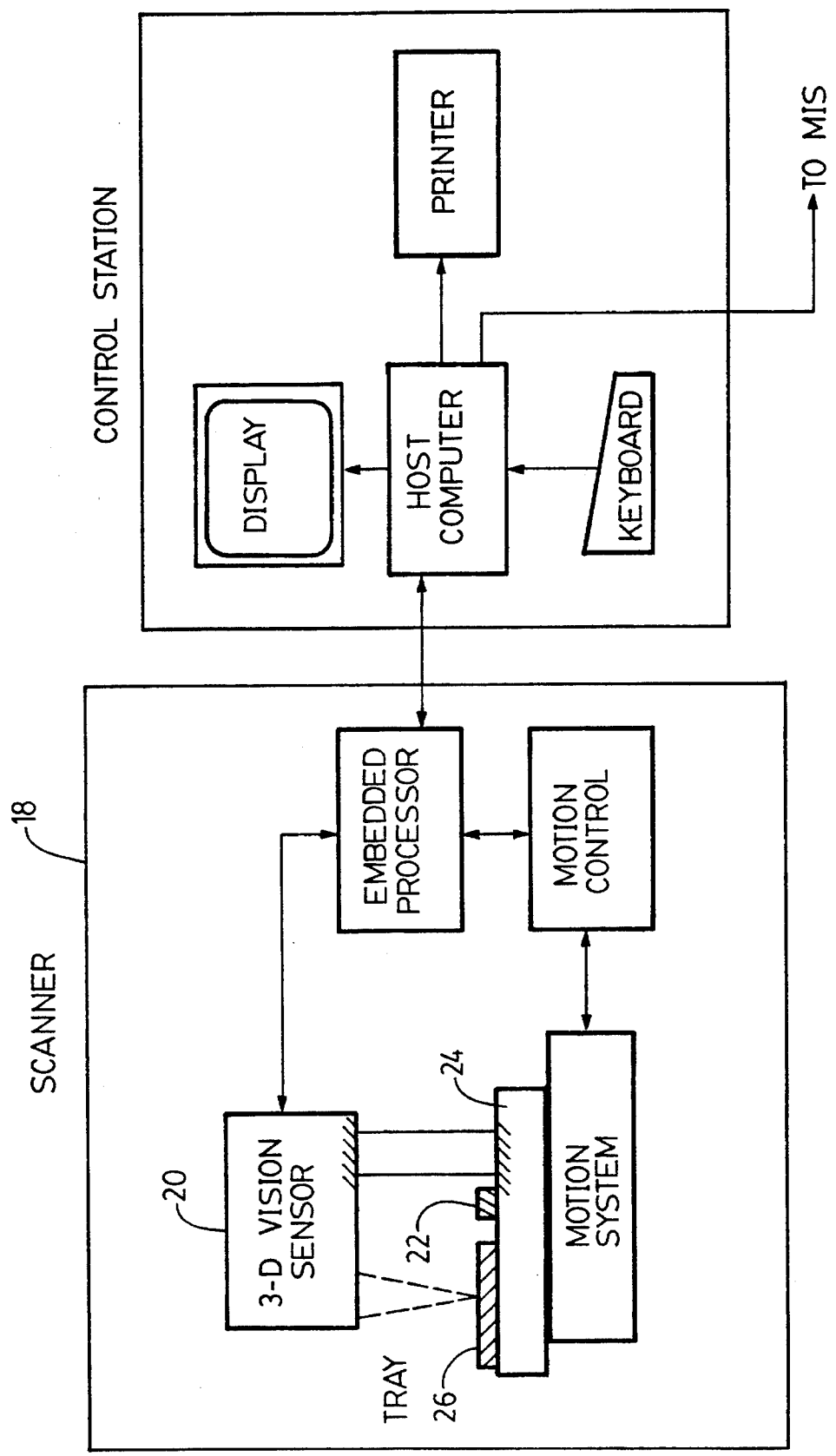
FIG._3.

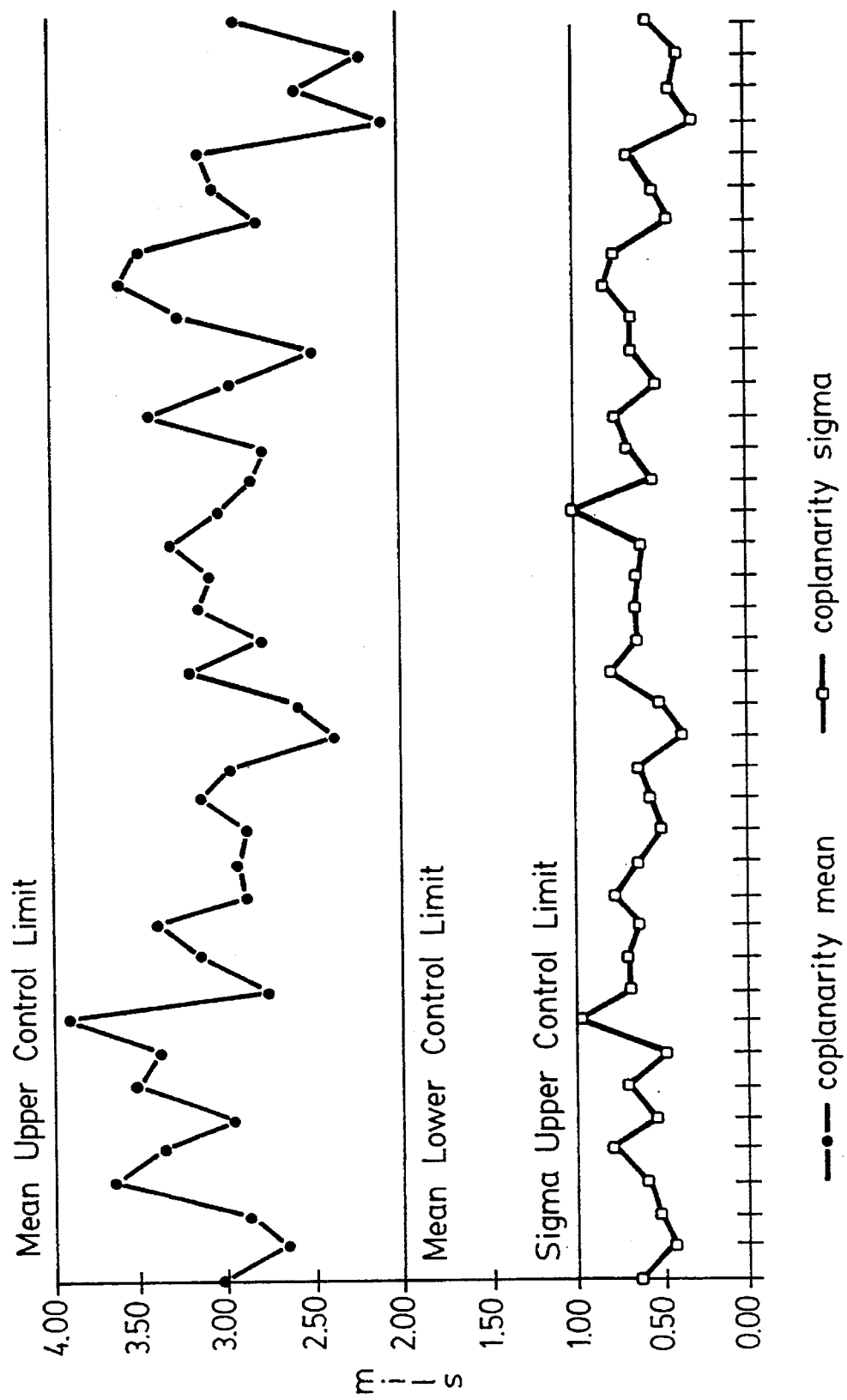
FIG._4.

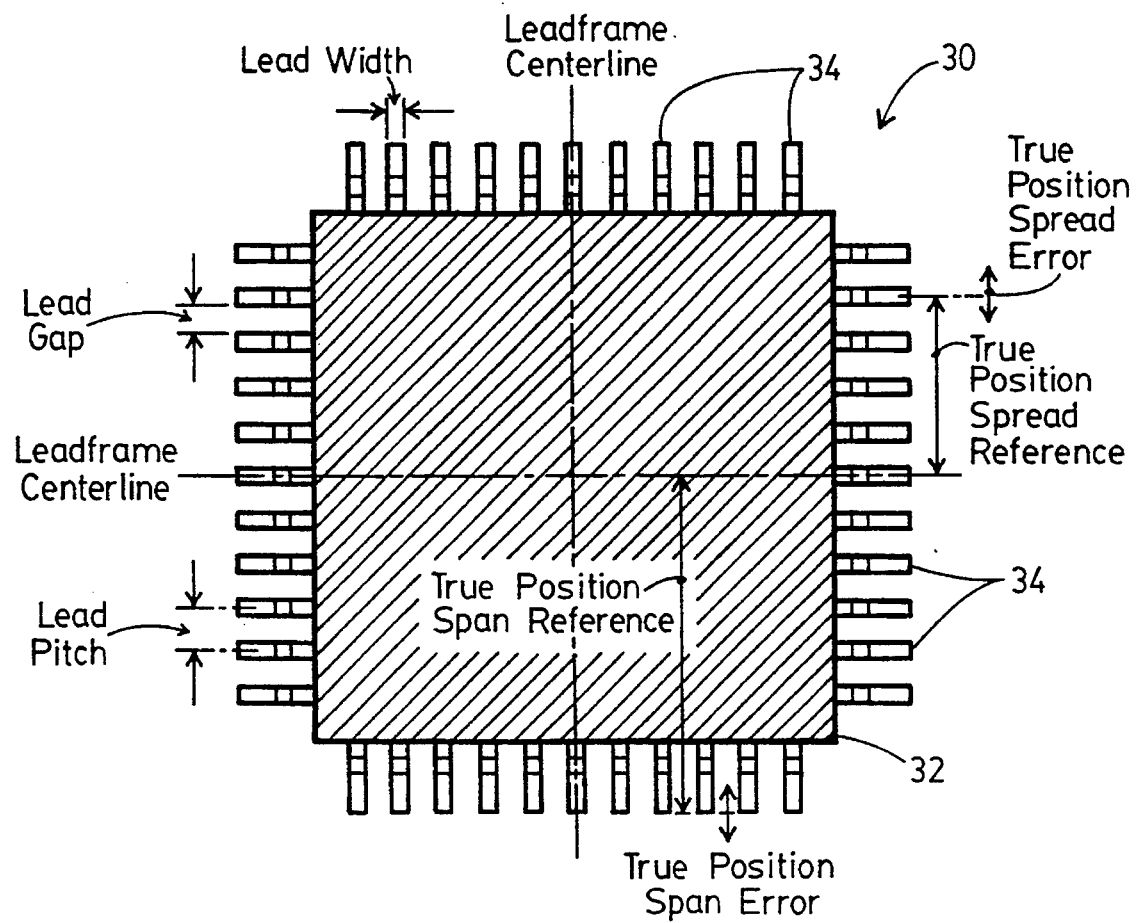
FIG._5A.
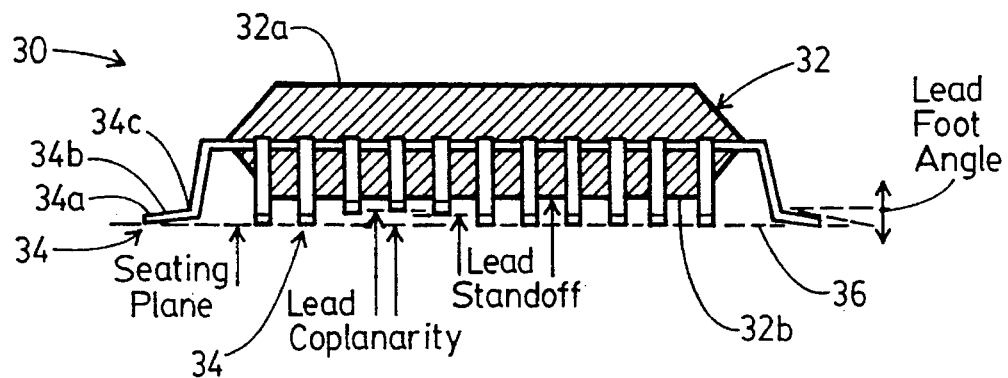
FIG._5B.

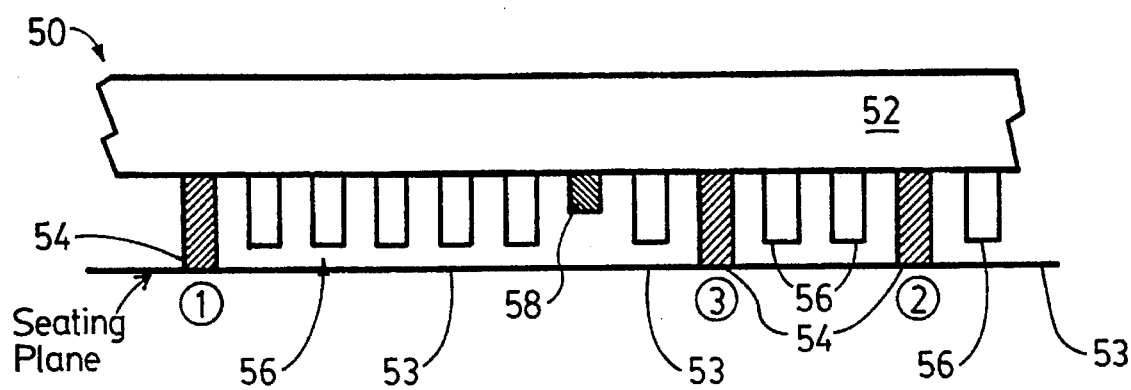
FIG._6.
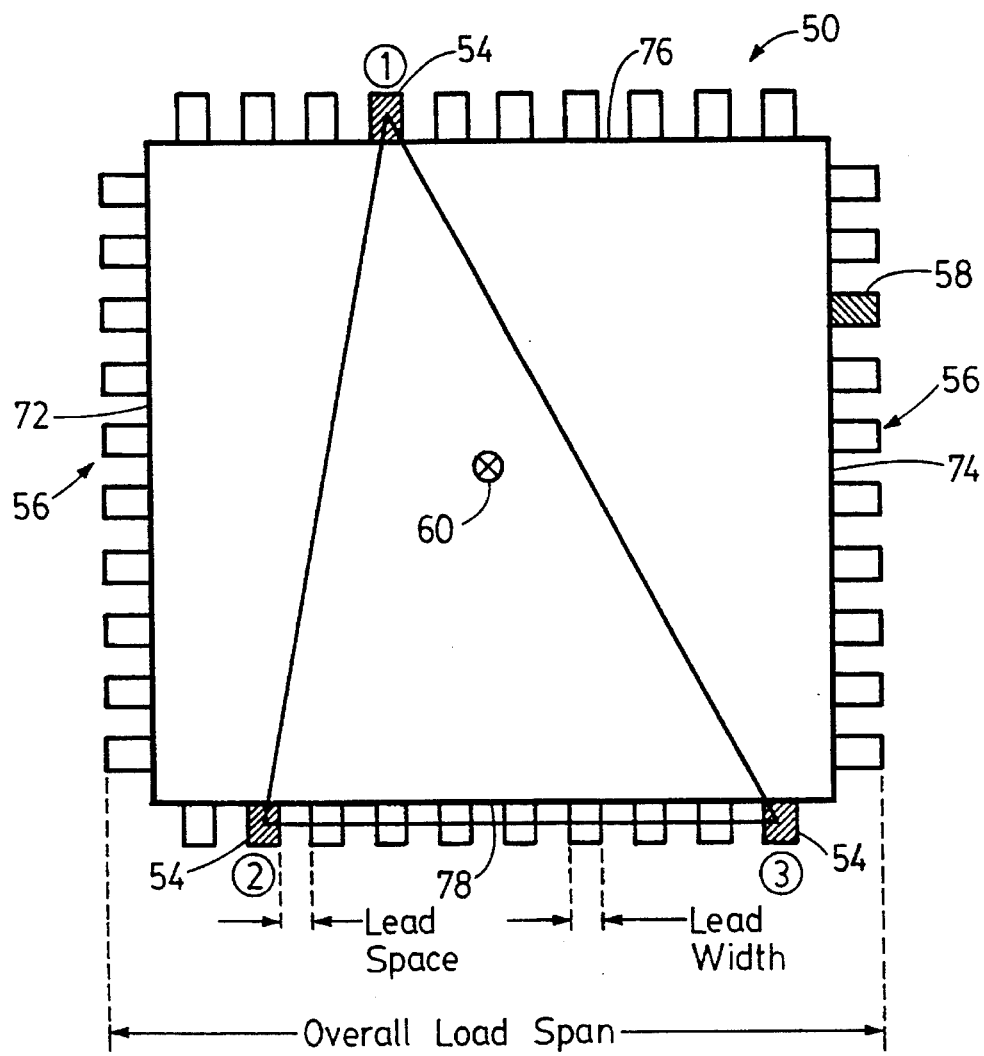
FIG._7

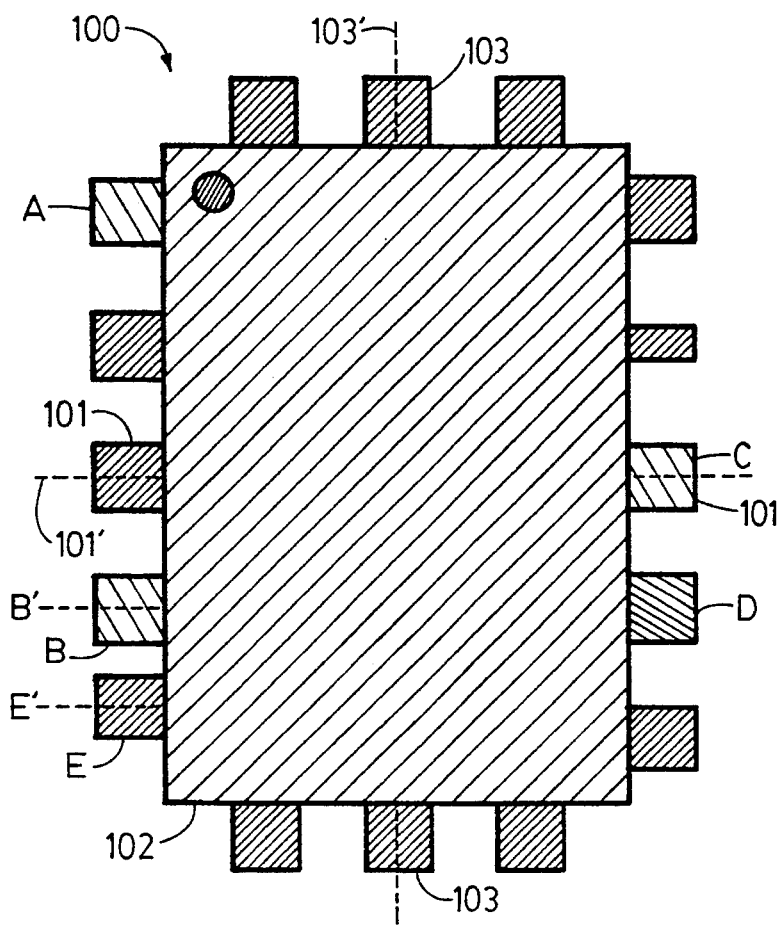
FIG._8A.
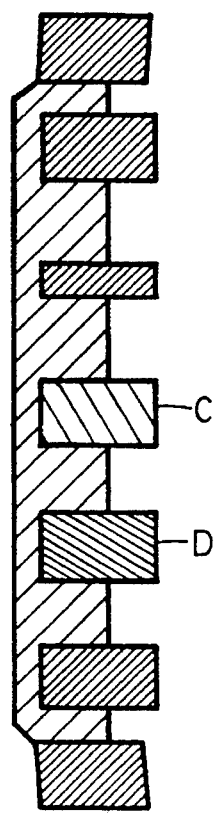
FIG._8C.
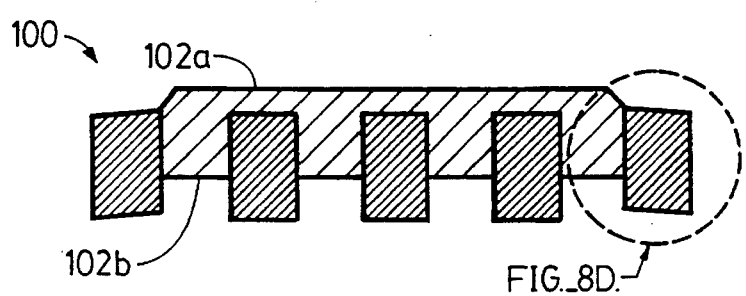
FIG._8B.
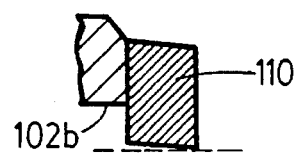
FIG._8D.

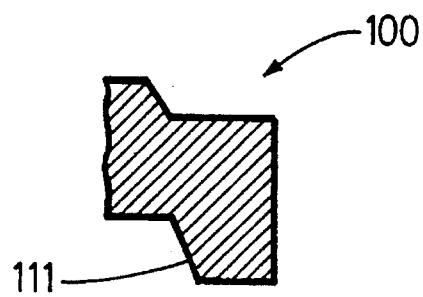
FIG._8E.
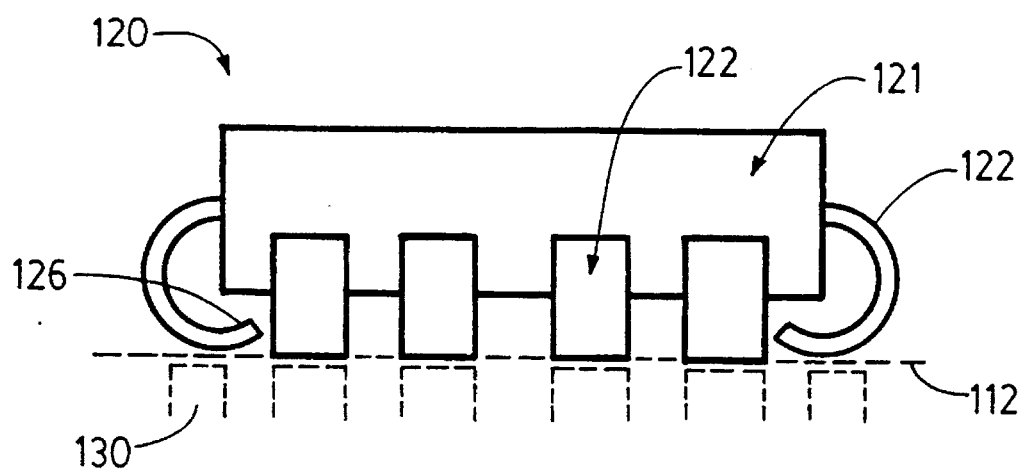
FIG._9.

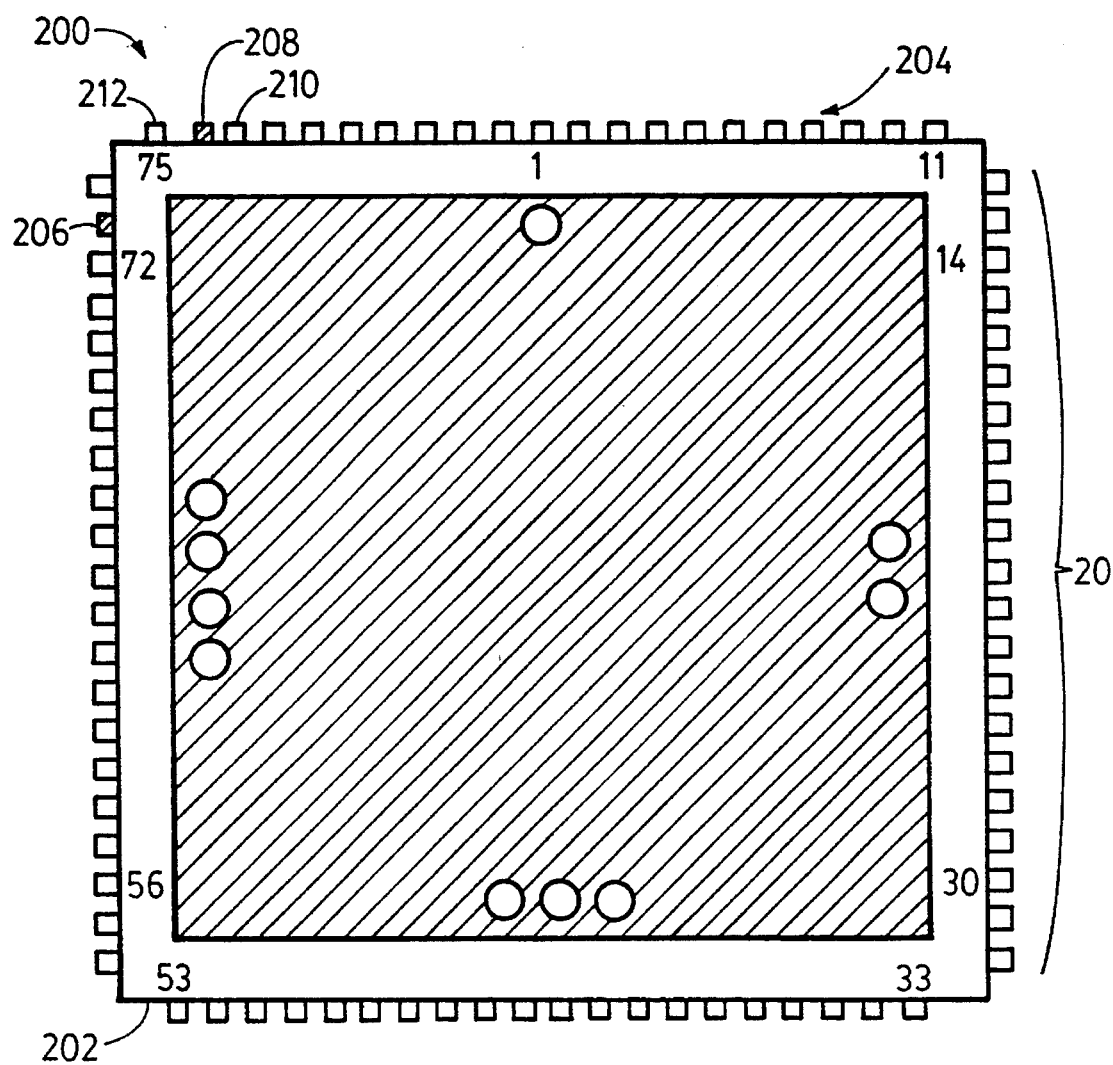
FIG._10.

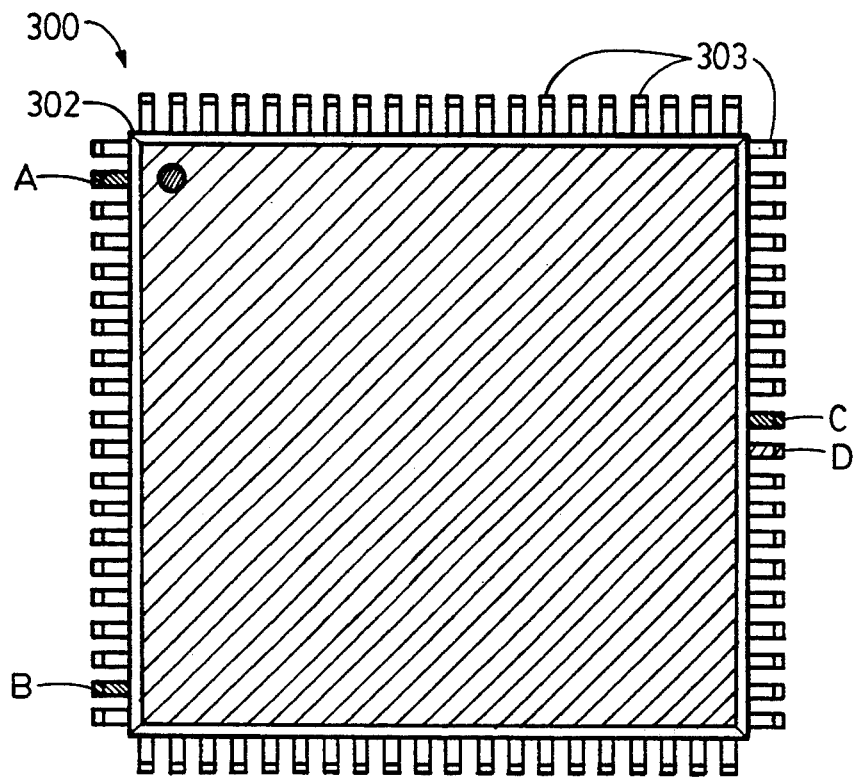
FIG._11A.
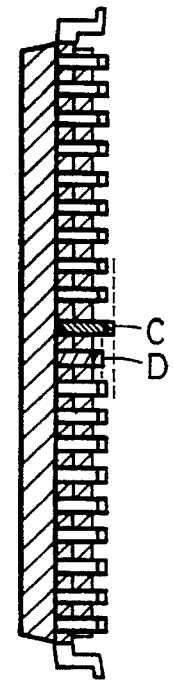
FIG._11C.
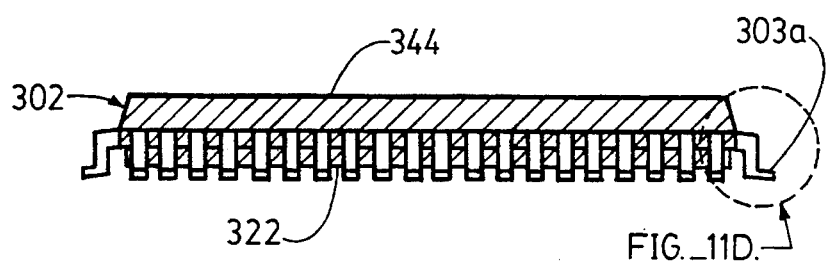
FIG._11B.
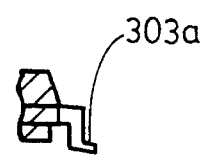
FIG._11D.

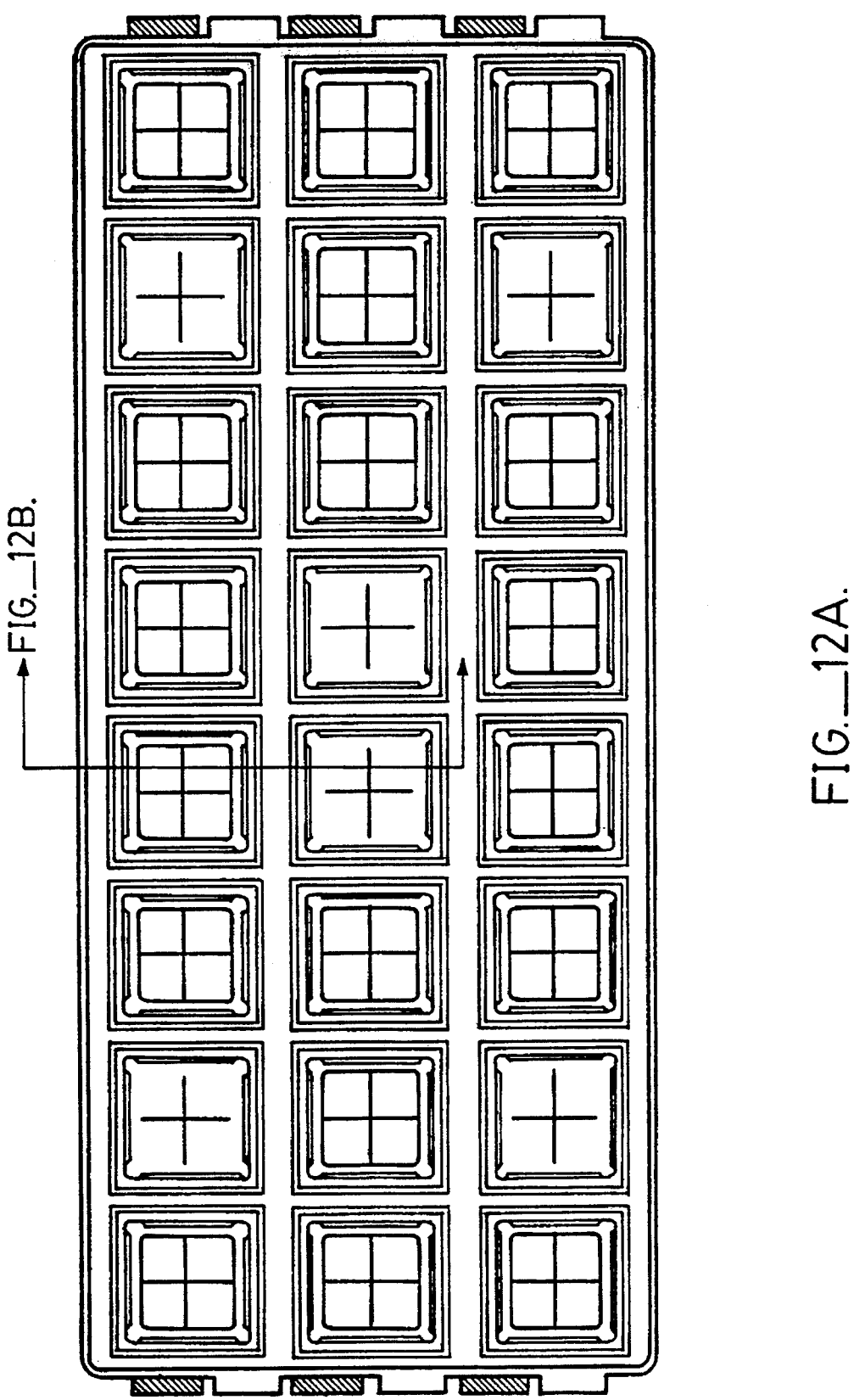
FIG._12A.
FIG._12B.

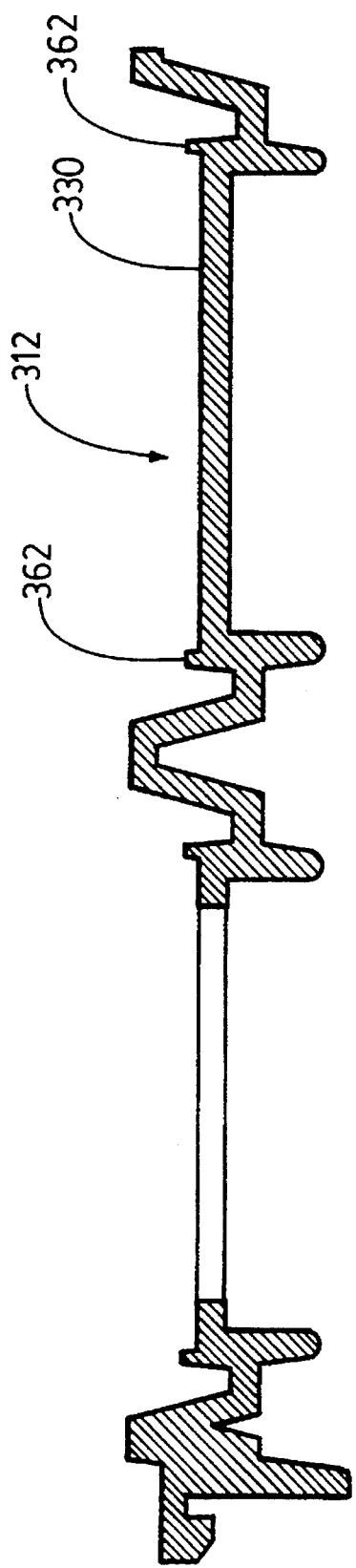
FIG._12B.

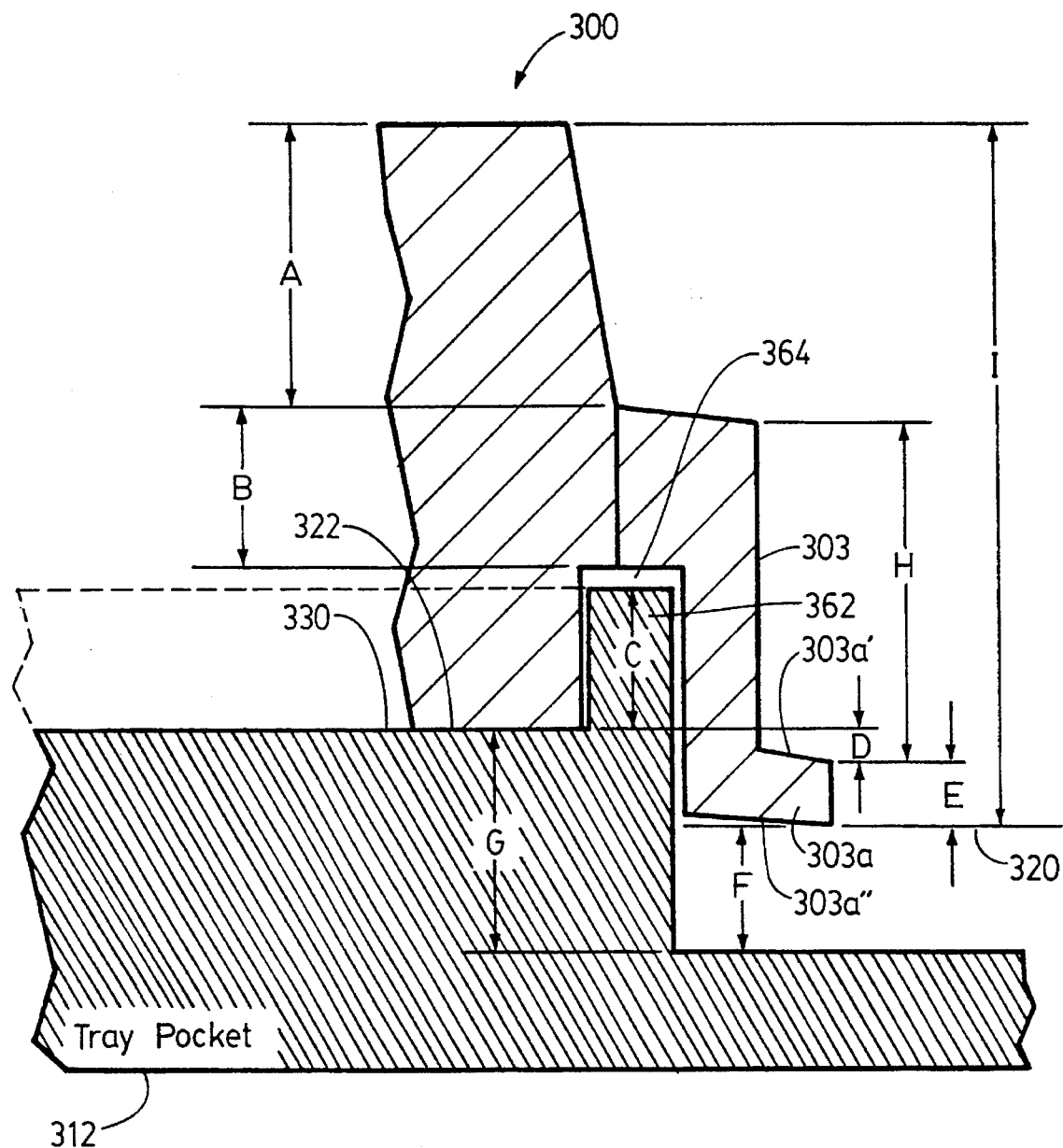
FIG._13.

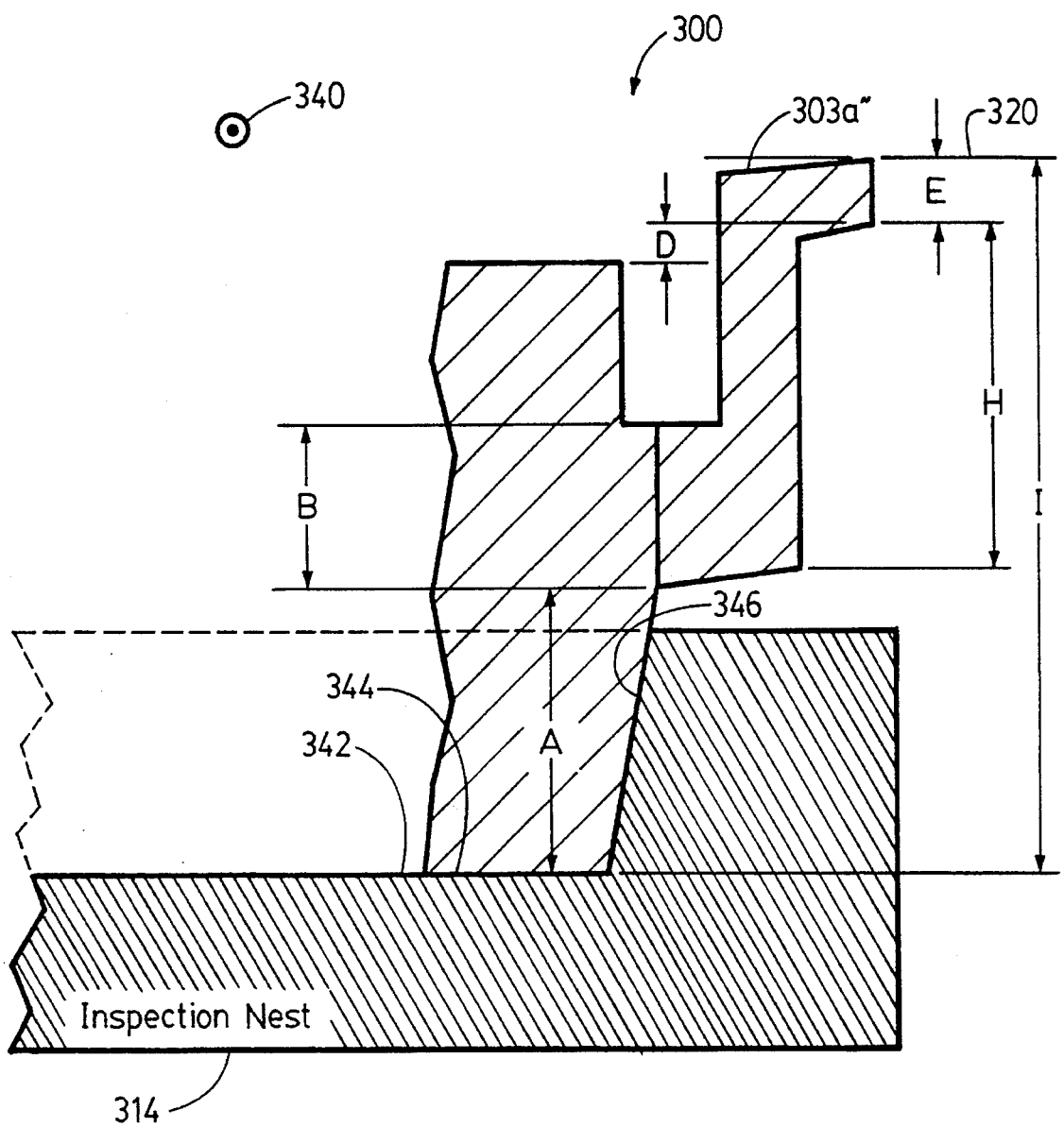
FIG._14.

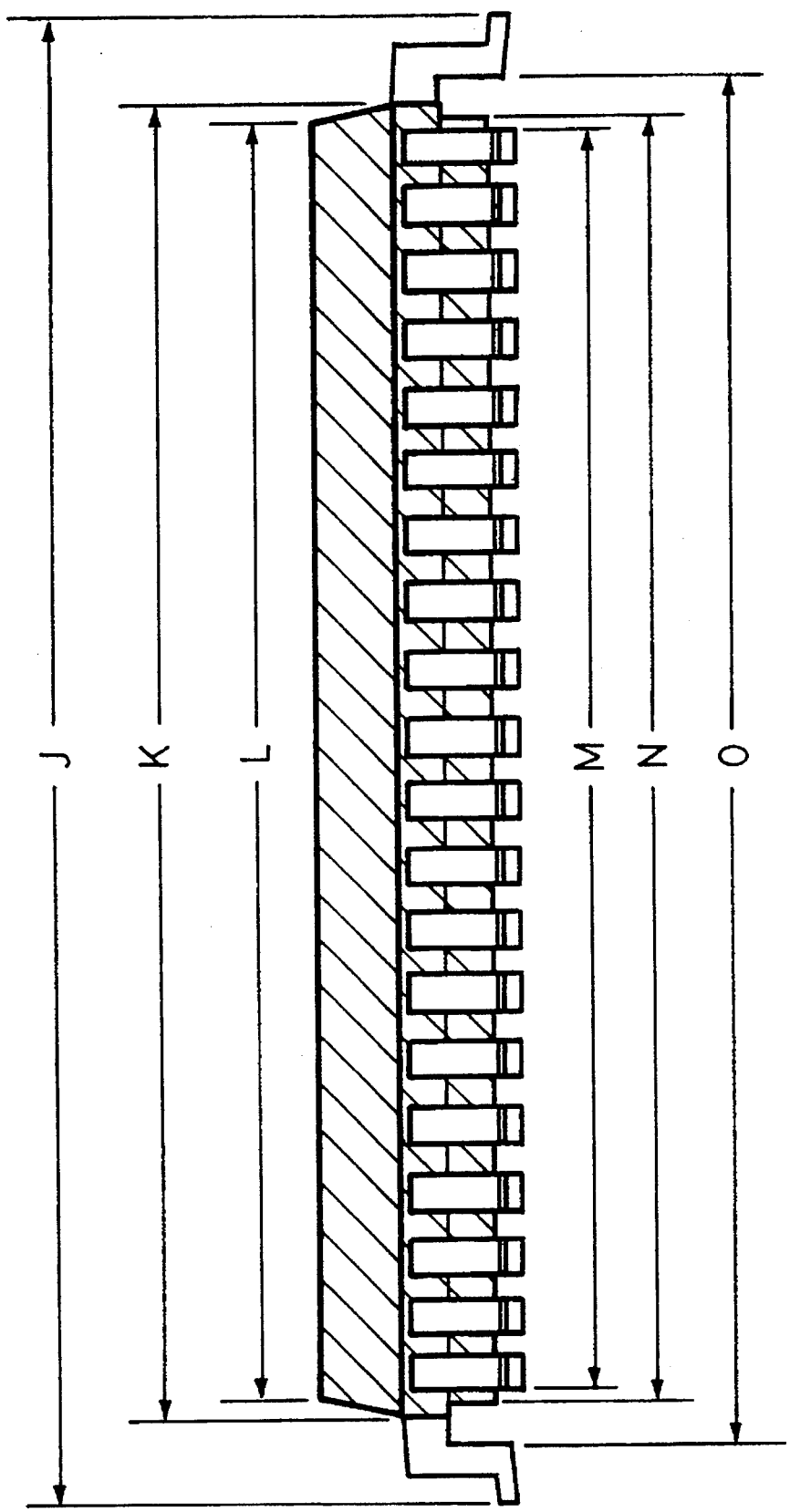
FIG._15.

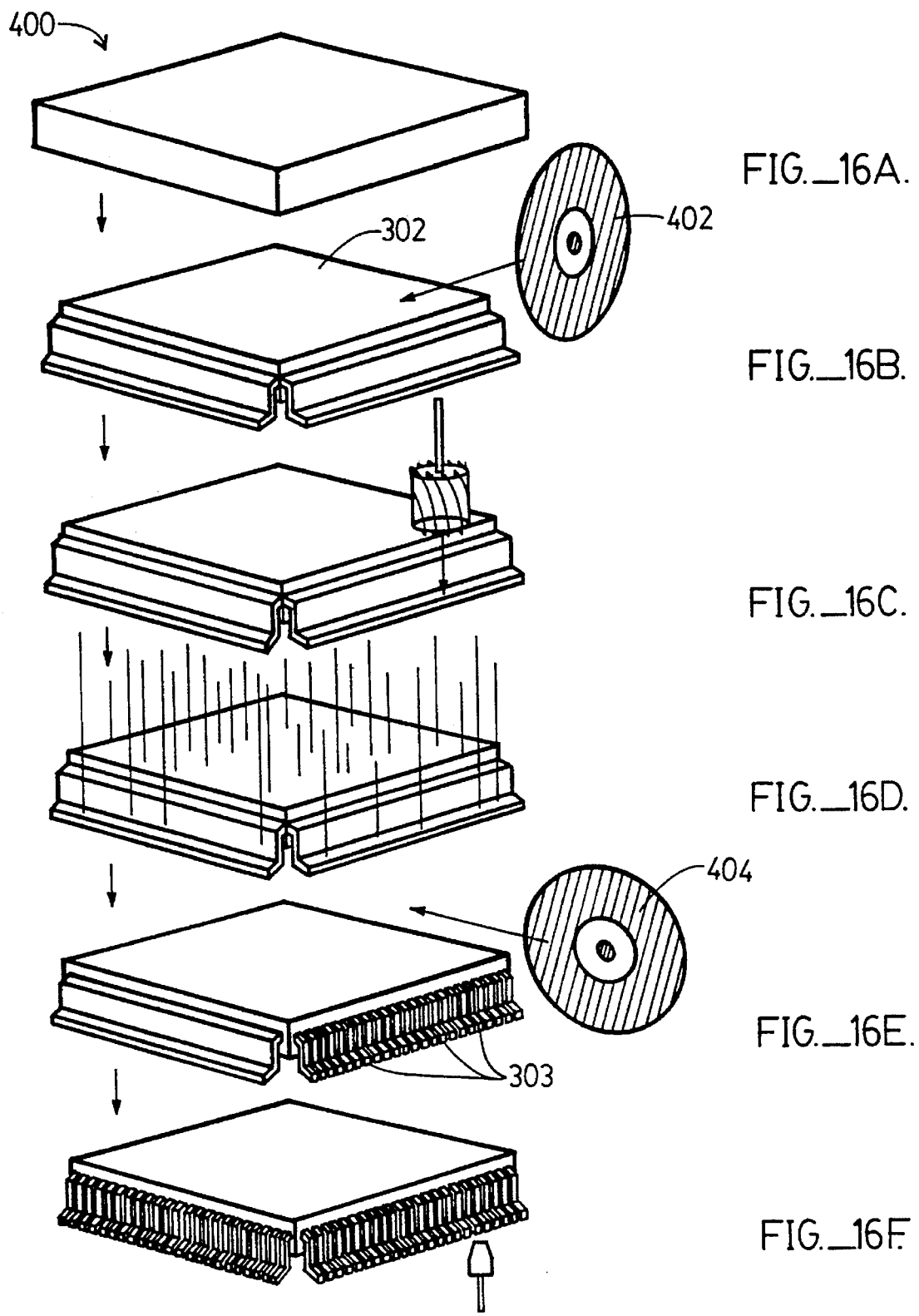
FIG._16A.
FIG._16B.
FIG._16C.
FIG._16D.
FIG._16E.
FIG._16F.

APPARATUS AND METHOD FOR TESTING THE CALIBRATION OF A VARIETY OF ELECTRONIC PACKAGE LEAD INSPECTION SYSTEMS

CROSS-REFERENCE TO RELATED APPLICATION

This is a continuation-in-part application of U.S. application Ser. No. 734,658 filed Jul. 23, 1991, pending, hereinafter referred to as the "Parent Application").

BACKGROUND OF THE INVENTION

This invention relates in general to electronic packaging technology and in particular, to apparatus and method for testing the calibration of electronic package lead inspection systems.

With increasing pressure to reduce electronic package size such as the size of packages for semiconductor dies, the trend in packaging technology is to reduce the size of the leads in order to increase pin counts. As pin counts of devices increase, characteristics such as lead coplanarity and lead-to-trace registration and other parameters become critical for the printed circuit board (PCB) assemblers. Poor package coplanarity will result in open connections between package pins and PCB traces, and poor lateral registration can result in open, shorts and misconnections. Due to customer demand, the integrated circuit (IC) manufacturers have to comply closely to customer specified package dimension parameters. No entirely satisfactory solution has been found to assure compliance with such specifications. Some compliance systems involve manual inspection using optical comparators or shadowgraphs while others are automated.

After the leads of the package have been trimmed or formed by an IC manufacturer, the leads are inspected by a lead inspection system. They are then packaged and shipped, if necessary, to a test site where they are further processed. At the test site, the leads are again inspected by a lead inspection system to ensure that the various important parameters of the leads still comply with specifications. After such further processing and testing, they are again packed and shipped to the PCB assemblers. Before the packages are mounted onto PCBs, the leads of the packages are again inspected by lead inspection systems. The above-described processing and handling of the package are illustrated in FIG. 1. FIGS. 1–4 as well as much of the discussion in the background of the invention have been taken from an article entitled "3-D Scanner for Quad Flat Package Measurement and Inspection," by Scott A. Erjavic and Sullivan Chen; the article was published in the 1991 Proceedings of Surface Mount International. The article is incorporated herein in its entirety by reference.

Plastic leaded chip carrier type packages are normally inspected using two-dimensional imaging inspection systems. Two-dimensional inspection systems typically evaluate component geometries either by a back-lit profile or a front- or oblique-lit reflection. Some applications utilize a combination of both. Back-lit imaging systems rely upon a sharp contrast being seen by the detector at the edge of the feature being inspected, i.e., the edge of the package lead. CCD arrays in the detector analyze the feature boundary for gray scaled transitions to/from black/white on adjacent array pixels. Absolute occurrence of objects on the array defines positional information with which the gray scale information is associated. In situations where pixel densities are high relative to the feature geometries, this method can provide very accurate positional information. But with a fixed density array, the ability to migrate to larger package sizes and higher lead counts and lead pitches is limited.

Quad flat pack (QFP) type packages are normally inspected using three-dimensional lead inspection systems. FIG. 2 illustrates a three-dimensional laser scanner using a laser source. As shown in FIG. 2, the light reflected from a lead of the package is focused by a lens towards a detector. The position of the detector that senses the reflection will indicate the Z-axis height information. The technique for measurement of X-axis and Y-axis location of the lead is well known. Many lead inspection systems employ different algorithms for computing different parameters that are important when the PCB assembler aligns and attaches the leads of the package to conductive traces on the PCB. Such algorithms are implemented by means of electronic systems.

Before the leads of a package are scanned as illustrated in FIG. 2, the package must first be removed from a shipment container from a test site as shown in FIG. 1 and delivered to the lead inspection site for scanning. When the various parameters important to the PCB assembler are calculated from the detector readings, various assumptions are made on the positions of the lead in relation to the laser and the detectors. Thus if the system for placing the package places the package at a location relative to the laser and detectors slightly different than what is assumed, the readings of the detectors will provide an inaccurate measurement of the parameters. The components in the electronics system for performing a different algorithm for calculating the parameters may also experience drift. All such factors may introduce slight variations or even large errors in the parameter measurements. A functional block diagram of a conventional laser inspection system is shown in FIG. 3.

To assist in the calibration of the scanner so that the above problems are alleviated, conventional scanner systems such as scanner 18 frequently employ a precision tool 22 of known NIST dimensions where tool 22 is at a known location relative to a 3-D sensor 20. In most cases, this means that the precision tool 22 is rigidly mounted onto the sensor support 24 which also supports a tray 26. Thus before sensor 20 is used to scan the leads in packages held in tray 26, sensor 20 is first initialized by scanning tool 22. Since tool 22 is of known NIST dimensions and at a location precisely known relative to sensor 20, the sensor can be calibrated relative to the scanner readings on the tool. Thereafter, when sensor 20 is used for scanning the leads or packages in tray 26, the sensor is sensing by reference to the tool of known NIST dimensions and at least some of the uncertainty in interpreting scanner readings will be reduced.

At the test site shown in FIG. 1, before the electronic packages are packaged and shipped to the PCB assembler, a small number (such as 35) out of a lot of packages (such as 2,000) are scanned using the scanner of FIGS. 2 and 3 to provide plots of the important parameters. These plots are compared to preset upper and lower limits in graphs such as those shown in FIG. 4 so that the scanner operator can ascertain whether the important parameters of the packages sampled are within the upper and lower limits. When such parameters sampled are within the prescribed limits, it is assumed that the same parameters for the whole lot are also within the upper and lower limits and the lot is then packaged and shipped to PCB assemblers. However, if plots of the parameters of some of the packages sampled fall outside the limits, it is then necessary to determine whether the leads of the packages are out of alignment or whether the lead inspection system or the package transport system are out of calibration.

Even with the aid of the precision tool described above, the large number of variables involved in the lead transport and lead scanning systems is such that it is still difficult to ascertain whether the lead inspection system or the package transport system itself is in error or whether the leads of the packages inspected are out of alignment. This determination is critical since misaligned packages should not be shipped to the PCB board assembler without any correction measures being taken. Furthermore, since lead inspection is performed at three different locations as shown in FIG. 1, different types of scanners used at the three sites or differences in their calibration make it even more difficult to identify the source of problems should they arise.

A number of commercial automatic lead scanners or inspection systems are presently available, such as the Texas Instruments 4,000 series (TI-40XX), or other series such as RVSI-LS2XXX, VIEW-7XXX and MVS-LaserVision. These different systems may inspect different portions of electronic packages and use different portions of the packages for reference parameters. Texas Instruments (TI) systems provide a profile view of the packages where the packages are placed with leads pointing upwards or in the "dead bug" position, where the package bodies of the packages are placed in a dedicated nest for holding the packages during inspection. The RVSI system, on the other hand, inspects the electronic packages when they are being held in regular package trays where the leads of the packages are pointing downwards or in the "live bug" position. Instead of using profile projection as in the TI system, the RVSI system shines a laser from a position above the electronic packages towards the top portions of the packages and the top surfaces of the leads, and the reflection of the laser from these parts of the packages is detected for lead inspection. It is typical for a semiconductor manufacturer to have different types of lead inspection systems at the same facility.

The calibration verification tool of the Parent Application is suitable for verifying the calibration of a particular kind of lead inspection system and not different kinds of lead inspection systems. For example, the calibration unit of FIGS. 8A–8D may be suitable only for testing the calibration of RVSI systems and not TI systems. It is therefore desirable to provide a calibration unit that is more universal than that described in the Parent Application, so that the calibration unit may be used for testing the calibration of different commercial lead inspection systems placed side-by-side at the same manufacturing facility. It is therefore desirable to provide a more universal system for testing the calibration of lead inspection systems.

SUMMARY OF THE INVENTION

The device of this invention is for testing the calibration of a system for inspecting leads of an electronic package comprising a package body and a leadframe having leads. For the purpose of proper alignment and connection to corresponding connection means, a limit of at least one predetermined position control parameter of said leads is defined relative to the leadframe or package body. When the actual positions of the leads are such that said limit is exceeded, the leads are not in proper alignment for connection to the connection means. The system for inspecting leads inspects the leads to provide readings that indicate whether the actual positions of the leads are such that said limit of at least one predetermined position control parameter is exceeded. The device is a test unit. The test unit comprises a unit body resembling said package body, and lead-resembling elongated members distributed around the unit body. The unit body is a plate having a top surface, and a bottom surface that defines a base plane. Each of the elongated members has a foot portion resembling a lead foot. The foot portions of three members have bottom surfaces that extend furthest below the base plane, the lowest points of such bottom surfaces of the foot portions defining a seating plane. The three members are at such locations around the unit body that, when the test unit is placed on top of a flat surface, the lowest point will contact the flat surface. The seating plane is less than about 150 mils from the top surface of the unit body and the foot portions of the members have top surfaces that are less than 10 mils from the base plane.

BRIEF DESCRIPTION OF THE DRAWINGS

FIG. 1 is a flow diagram illustrating the process for IC package manufacture, testing and assembly.

FIG. 2 is a schematic view of a scanner and a lead to illustrate the scanner portion of the lead inspection system.

FIG. 3 is a functional block diagram of a lead inspection system.

FIG. 4 is a graphical illustration of the scanner readings of an important parameter (coplanarity) for indicating the condition of the leads.

FIG. 5A is a top view of a quad flat pack (QFP) package to illustrate the invention of the Parent Application.

FIG. 5B is a side view of the package of FIG. 5A.

FIG. 6 is a schematic side view of a verification unit for testing the calibration of a lead inspection system for inspecting QFP packages to illustrate an embodiment of the invention of the Parent Application.

FIG. 7 is a top view of the unit of FIG. 6.

FIG. 8A is a top view of a verification unit for testing the calibration of a lead inspection system for inspecting QFP packages to illustrate the preferred embodiment of the invention of the Parent Application.

FIGS. 8B, 8C are two side views of the unit of FIG. 8A, viewing the unit in directions perpendicular to each other.

FIG. 8D is a cross-sectional view of a portion of the unit of FIG. 8B.

FIG. 8E is a cross-sectional view of a portion of the unit of FIG. 8B to illustrate the invention of the Parent Application.

FIG. 9 is a side view of a simplified plastic leaded chip carrier (PLCC) package for illustrating the invention of the Parent Application.

FIG. 10 is a top view of a verification unit for testing the calibration of a lead inspection system for inspecting a PLCC type package to illustrate an alternative embodiment of the invention of the Parent Application.

FIG. 11A is a top view of a universal verification unit for testing the calibration of the lead inspection system for testing QFP packages to illustrate the preferred embodiment of the invention of this application.

FIGS. 11B and 11C are two side views of the unit of FIG. 11A, viewing the units in directions perpendicular to each other.

FIG. 11D is a cross-sectional view of a portion of the units of FIG. 11B within the circle 11D of FIG. 11B.

FIG. 12A is a top view of a shipping tray for carrying PQFP packages.

FIG. 12B is a cross-sectional view of a portion of the tray of FIG. 12A shown along the line 12B—12B in FIG. 12A.

FIG. 13 is an enlarged view of a portion of a shipping tray such as that shown in FIG. 12B and of a portion of the universal verification unit of FIG. 11B sitting in the shipping tray to illustrate the "live bug" position during lead inspection.

FIG. 14 is an enlarged cross-sectional view of a portion of the universal verification unit of FIG. 11B and of a portion of an inspection nest showing the position of the unit in a "dead bug" position during lead inspection.

FIG. 15 is an enlarged view of the universal verification unit of FIG. 11B to illustrate the relative dimensions of the unit.

FIGS. 16A–16F are perspective views to illustrate a method for making the universal verification unit of the present application.

DETAILED DESCRIPTION OF THE PREFERRED EMBODIMENT

The description below in FIGS. 5A–10 are taken from the parent application.

FIG. 5A is a top view of a QFP type package for the purpose of illustrating the important parameters used in aligning the leads to conductive traces of PCBs and to physically attach and electrically connect the leads to such traces. While package 30 of FIG. 5A is shown to have only forty-four leads 34, it will be understood that the concept of the invention of the Parent Application and this application is applicable for testing the reliability of lead inspection systems for inspecting packages with a greater number or smaller number of leads as well. The same is true for other packages shown in the figures of this application, including the PLCC package of FIG. 9 described below.

The most convenient frame of reference for the positions of the leads is the leadframe. The leadframe center line is determined as a result of a least squares fit calculation on a definable center grouping of leads from opposite sides of the leadframe; corner leads are specifically excluded from this grouping. Such calculation is known to those skilled in the art and will not be elaborated here. A true position spread reference is calculated for each lead on the package. The references extend from a side leadframe center line to the expected location of the center of each lead tip on the same side, as specified in FIG. 5A. One definition of the true position spread error is the deviation (side-to-side) of the lead tip center from the expected reference position. The true position span reference is calculated for each lead on the package. The reference extends from a leadframe center line to the expected location of the tip of each lead on the sides parallel to the center line, as specified in FIG. 5A. For proper alignment with the trace footprint of the PCB, the key lead form parameters include the lead width, lead gap, lead pitch, true positions spread error, and true positions span error. Lead width is the width of the lead measured at the lead tip. Lead gap is the space between adjacent lead tips and lead pitch is the distance between center lines of adjacent lead tips.

Another set of key lead form parameters is illustrated in reference to FIG. 5B. As shown in FIG. 5B, package 30 has a package body 32 and leads 34. Body 32 is in the shape of a plate and has a top surface 32a and a bottom surface 32b which defines a base plane. When package 30 is placed on a PCB with surface 32a on top and surface 32b facing the PCB, the ends 34a of leads 34 will rest on and be in contact with the top surface 36 of a PCB.

When the package is placed on a flat surface to simulate the PCB with the bottom surface 32b facing the flat surface, the package 30 will actually come to rest on a minimum of three leads. These are the lowest leads of the package, and the surface upon which they rest is defined as the seating plane 36. When viewed from above, the center of gravity of the package (usually the center of the package body) must be contained in the triangle defined by the three lowest leads. Each device has its own seating plane. Each lead has a value of coplanarity relative to the seating plane. The lowest point of each lead is the point of measurement. The three or more leads which define the seating plane have a coplanarity value of "0;" every other lead has a positive coplanarity because they are each higher than the seating plane. The maximum of the individual lead coplanarity values is additionally considered as the coplanarity of the device itself.

Another key parameter is the lead standoff. Each lead has a value of standoff relative to the planar surface defined by the bottom of the package body, or the base plane. The measured value of each lead's lowest point from the base plane is defined as its lead standoff. The device standoff is defined as the minimum distance of the base plane 32b from the seating plane 36. Another important lead form parameter is the lead foot angle, which is the inclination or declination in degrees of the tip 34a of the lead "foot" (lower form section) 34b from the "heel" (lower form bend) 34c of the lead, relative to the seating plane 36. Positive values of lead foot angle indicate that the tip is lower than the heel; negative values indicate that the tip is higher than the heel.

The invention of the Parent Application is based on the observation that a verification unit resembling package 30 of FIGS. 5A, 5B may be constructed from a sturdy material and have such dimensions that the key lead form parameters such as those listed above can be simulated. Then when the scanner 18 of FIG. 3 is used to scan such verification unit, the readings of the scanner can be compared to the key parameters simulated by the verification unit in order to determine whether the scanner as well as other portions of the lead inspection system have been properly calibrated. The invention of the Parent Application is based also on the observation that, unlike the precision tool which is fixedly mounted onto the scanner support, exact duplicates of the verification unit can be made for use at all three sites shown in FIG. 1, thereby serving as a common reference for the purpose of testing the calibration of lead inspection systems at all three sites.

FIG. 6 is a schematic side view of a verification unit 50 for testing the calibration of a lead inspection system for inspecting QFP packages to illustrate an embodiment of the invention of the Parent Application. As shown in FIG. 6, verification unit 50 has a unit body 52 which resembles package body 32 of FIGS. 5A, 5B, and lead resembling members which resemble leads 34. Again a seating plane 53 is defined by the lowest points of the three lowest lead resembling members 54. The remaining members 56, 58 all have positive coplanarity. One lead resembling member 58 has a positive coplanarity which is equal to the tolerance acceptable for coplanarity of the leads, which may be 4 mils. For future packages, such tolerance may even be as small as 2 mils, in which case the coplanarity value of member 58 is 2 mils. In other words, member 58 is purposely constructed to have a higher positive coplanarity value than the remaining members where the positive coplanarity value of member 58 is equal to the outer limit of acceptable deviations from the seating plane. As a practical matter, many if not most of the deviations from coplanarity in packages will have values close to such positive coplanarity value of member 58. The remaining members 56 may have positive coplanarity values that are smaller than that of member 58. Therefore, when members 54, 56 and 58 are inspected by a lead inspection system to provide readings on coplanarity, such readings can be compared to the known positive coplanarity values of members 56 and 58 for testing the calibration of the lead inspection system.

FIG. 7 is a top view of the unit 50 of FIG. 6. As shown in FIG. 7, the three members 54 defining the seating plane form a triangle from the top view, where the triangle encloses the center of gravity 60 of the package. In this manner, when the package sits on a flat surface, the three members 54 will be the only ones in contact with the flat surface.

One of the key requirements of a verification unit is that it should not change dimensions despite rough handling. Since the actual lead widths of a QFP package such as package 30 can be as small as 10–20 mils or below, a verification unit with members resembling the leads of package 30 may become deformed upon frequent handling irrespective of the type of material used to construct the verification unit. Furthermore, with members of such small widths (10–20 mils), the limit of machine tools are such that it is difficult to construct a verification unit with precise measurements. For this reason, in the preferred embodiment of the Parent Application, cubical blocks are used instead of the elongated lead resembling members of FIGS. 6 and 7; such blocks are shown in FIGS. 8A–8E.

FIG. 8A is a top view of a verification unit 100 to illustrate the preferred embodiment of the invention of the Parent Application. As shown in FIG. 8A, verification unit 100 has a unit body 102 which preferably has the same dimensions as a package body such as body 32 of FIGS. 5A, 5B. Unit 100 also has a plurality of blocks either integral with or attached to the unit body. FIGS. 8B, 8C are side views of unit 100 of FIG. 8A from two directions which are perpendicular to each other. Unit body 102 has a top surface 102*a* and a bottom surface 102*b* defining a base plane. Unit 100 has a plurality of blocks surrounding body 102. Three of the blocks A, B, C have surfaces which extend the furthest from bottom surface 102*b*; the lowest points of the surfaces of these three blocks therefore define a seating plane. Blocks A, B, C each has a depth of 1.40 millimeters. As shown in FIG. 8C, the distance between the bottom surface of block C (and also of blocks A and B) and bottom surface 102*b* is about 1.4 millimeters, whereas the bottom surfaces of all the blocks except blocks A, B, C, D are 1.35 millimeters from bottom surface 102*b*. The bottom surface of block D, however, is only 1.3 millimeters from the bottom surface 102*b*. Therefore, block D has a positive coplanarity value of 0.1 millimeter and all the remaining blocks (that is, except blocks A–D) have positive coplanarity values of 0.05 millimeters. When the lead inspection system inspects bottom surface 102*b* and the bottom surfaces of the blocks, it will provide readings on the coplanarity values of the various blocks. A comparison of such readings to the actual values, such as those shown in FIG. 8C, will indicate whether the lead inspection system has been properly calibrated.

As shown in FIG. 8A, the blocks simulate a lead pitch of 4 millimeters, lead widths of 1 and 2 millimeters, and lead gaps of 1 millimeter and 2.5 millimeters. In order to achieve precise measurements of the members, the blocks preferably have widths not less than about 0.5 mm, and the gaps between adjacent pairs of blocks are not less than about 0.5 mm.

FIG. 8D is a cross-sectional view of a portion of unit 100 of FIG. 8B. As shown in FIG. 8D, the bottom surface of one of the blocks 110 is not parallel to the bottom surface 102*b* and is at a slight angle of about 5° as shown in FIG. 8D to the base plane. Thus when the lead inspection system inspects such surface, it will provide a reading of such angle which simulates the lead foot angle. Comparison of such reading to the actual value of the angle will indicate whether the system is properly calibrated. As shown in FIGS. 8A–8E, the blocks or members extend from the sides of plate 102 by distances in the 1–2 millimeter range, defining the span of the blocks. As shown in FIGS. 8A, 8D, the device standoff (minimum distance between base plane and seating plane) is in the 1.30–1.40 millimeter range. It is preferable for such device standoff to be not less than about 0.5 mm so that unit 100 is easier to construct; it will be understood, however, to resemble an actual device standoff, unit 100 may be modified so that the device standoff is in the range of 0–20 mils. In the same vein, the bottom surface of block 110 may be at an angle in a range of about 0°–8° to the base or seating plane. As shown in FIG. 8D, block 110 has the same vertical dimension (i.e., the dimension that is perpendicular to the base plane 102*b*), which is 3.31 millimeters. Therefore, also shown in FIG. 8D, the top surface of block 110 is also at a selected angle to the base plane; in the embodiment illustrated in FIG. 8D, such angle is 5°. Similarly, all sixteen blocks of unit 100 in FIG. 8A have the same vertical dimension.

As indicated above in reference to FIGS. 8A–8E, in order to achieve precise measurements, blocklike members are used instead of lead resembling members. For this reason, the number of members are smaller than the number of leads in the corresponding package. As shown in FIG. 8A, the unit body 102 is in the shape of a rectangular plate of a certain thickness, and has a length and width. If the length of the unit is 20 millimeters with a width of 14 millimeters, the number of members may be within the range of 10–100. Where the unit body is at 28 millimeter square plate, the number of members may be in the range of 20–208.

In general, semiconductor packages are designed such that where the number of leads on one side of the package is even-numbered, the leads are evenly distributed so that the distance between adjacent leads are the same and so that there is a center gap between adjacent leads located at the mid-point of such side of the package body. Where the number of leads on one side are odd-numbered, there would be a center lead located at the midpoint of the package body. As shown in FIG. 8A, the number of members on each of the four sides of the unit body 102 is odd-numbered (5 and 3). Center blocks 101 are each located respectively at the midpoints of the left and righthand sides of unit body 102 and center blocks 103 are located respectively each at the midpoints of the top and bottom sides of unit body 102. As shown in FIG. 8A, except for block E, whose center line E' is at a distance of 3 millimeters from the center line B' of block B, the distance between the center lines of adjacent blocks for the remaining blocks on all four sides of body 102 is about 4 millimeters. This is the case even though the block width of one of the blocks on the right side of body 102 is smaller than the block widths of the remaining blocks.

The above-described configuration of the members is useful for testing the leadframe center line calculation algorithms as implemented in the lead inspection system. First, a set of two mutually perpendicular leadframe center lines are calculated using the center blocks 101, 103. One center line 101' simply bisects both blocks 101 and the other center line 103' bisects the two blocks 103. The locations of the remaining blocks in reference to these two center lines may then be computed. A second set of center lines is then computed as follows. All sixteen blocks are included in this calculation. Thus for the five blocks each on the left and right side of body 102, all five blocks on each side are included. Since the distance between the center lines B', E' is smaller than the distance between the center lines of any other pairs of adjacent blocks, the leadframe center line calculated based on the two sets of five blocks will be different from the first set of leadframe center lines calculated based on blocks 101, 103 only. The locations of the blocks relative to the second set of leadframe center lines are then calculated. The locations of the blocks relative to the two sets of center lines computed in the manner above are then compared to preset values already calculated beforehand for unit 100 of FIG. 8A. Such comparison will indicate whether the system properly implements the leadframe center line calculation algorithm.

The description of the verification unit in reference to FIGS. 6, 7, 8A–8E herein are in reference to the testing of a lead inspection system for inspecting QFP packages. It will be understood, however, that a substantially similar unit may be constructed for testing a lead inspection system for inspecting PLCC type packages as well. For PLCC type packages, as well as for some QFP packages, it may be adequate to use a verification unit which is simpler than that described above. Such simpler type of verification unit is described below by reference to PLCC type packages. It will be understood, however, that the unit described below in reference to FIG. 10 may also be adequate for testing lead inspection systems used to inspect QFP type packages.

FIG. 9 is a schematic side view of a PLCC type package 120 to illustrate the invention of the Parent Application. The number of leads 122 of the PLCC package shown has been reduced to simplify the drawing. Different from the QFP package, leads 122 of the PLCC package curve under the package body 121. Again the positive coplanarity values of the leads are defined with respect to a seating plane 112 in a manner similar to that described above for a QFP package.

FIG. 10 is a bottom view of a verification unit 200 resembling a PLCC type package. Unit 200 has a unit body 202 which has substantially the same dimensions as the PLCC package body 121. In reference to FIG. 9, each of the leads 122 has a predetermined proper position for proper alignment with the footprint traces 130 on the PCB. The members 204 are of the same dimensions as their corresponding leads 122 and are located relative to the unit body 202 in the same manner as the predetermined proper positions of the leads 122 relative to the leadframe (not shown) in the package or to package body 121, except that at least one of the members 206 or 208 deviates from the predetermined position of the corresponding lead. Thus when the lead inspection system inspects the position of lead 206 or 208 relative to the unit body 202 to provide a reading, the reading will indicate whether the system is properly calibrated. Unit body 202 is a substantially flat, rectangular or square plate, where the members are distributed at or near the edges of the plate. Preferably, member 206 and/or 208 are located at or near a corner of the plate as shown in FIG. 10. The bottom surfaces of members 204 define also a seating plane similar to seating plane 112 in FIG. 9; the bottom portions of members 204, 208 are substantially in such plane whereas the bottom portion of member 206 deviates from said plane by a preset distance (not shown in FIG. 10) in a manner analogous to the QFP situation illustrated in FIG. 6. As shown in FIG. 10, member 208 is laterally displaced so that it is closer to its adjacent member on the right (210) and further away from its adjacent member to the left (212) compared to the even spacing between other members 204. When lead inspection systems inspect members 204, 206 and 208, such readings will provide readings on coplanarity, lead gap and lead pitch where a comparison of such readings to the actual values of unit 200 will indicate whether the systems are properly calibrated.

It is preferable to provide members 206, 208 at or near the corners of unit 200. Since lead inspection systems typically operate using optical principles, points at the edge of the field of vision are frequently where the greatest errors of optical instruments are located. This is due to the fact that optical systems frequently employ lenses. Therefore, if readings provided on members 206, 208 at or near a corner of unit 200 (and thus at the edge of the field of vision) indicate that the system is properly calibrated, in all likelihood the readings provided at points away from the edge of the field of vision will also be accurate.

As shown in FIG. 10, the bottom surface of unit body 202 has a cavity therein so that unit 200 is of substantially the same weight as an actual PLCC package. This may be important for the reason that vacuum systems are normally used for stopping unit 200 in a transport track and for aligning the unit to a scanner. If the weight of unit 200 differs significantly from an actual package to be measured, a vacuum system calibrated for aligning an actual package may cause unit 200 to be misaligned with respect to the scanner. In the same vein, unit 100 of FIGS. 8A–8E is preferably also of substantially the same weight as an actual QFP package so that the vacuum suction device designed to pick and place a QFP package can be suitably used to pick and place unit 100. Units 100, 200 are preferably made of a sturdy material such as stainless steel. Since lead inspection systems function by optical principles, the reflectivities of the surfaces of units 100, 200 preferably resemble the actual packages and simulate their reflectivities. In order for units 100, 200 to be rugged, it may be preferable for the surfaces of the units not to be coated, although a black oxide coating (by oxidizing the surface of the stainless steel material) has been found to be satisfactory. The black oxide coating may be accomplished, for example, by dipping the units in a solution of sodium nitrate (which contains nitrite) and then baking the units. The detailed process for making such coatings is known to those skilled in the art and will not be elaborated here. As shown in FIGS. 8A–8E, the top surface of unit body 102 is chamfered for a better fit "dead bug" (that is, upside down) into holding pockets in trays.

Where the unit body 102 is to be held "live bug" (that is, rightside up) in the holding pockets in trays, the side surfaces of the sixteen blocks of FIG. 8A adjacent to the bottom surface 102b of the unit body are also chamfered as shown in FIG. 8E. As shown in FIG. 8E, the chamfered surface 111 permits unit 100 to be held in a holding pocket without causing the blocks to come into contact with supporting pedestals (not shown) in the holding pockets of trays. In order for the reflectivities of units 100, 200 to resemble actual packages, it may be preferable to grind at least some of the surface of the units to provide matted surfaces on the units. Such matted surfaces are particularly helpful when present on key surfaces such as the top and bottom sides 102a, 102b of unit body 102 and the top and bottom side of members such as member 110. These surfaces are marked by a @ in FIGS. 8B, 8C.

In the method of this invention of the Parent Application, a test unit such as units 100, 200 is provided. The lead calibration system is then used to inspect the unit and to provide readings on one or more key parameters for proper alignment and connection to PCB. From the readings, the system operator can then determine whether the system is properly calibrated. As shown in FIG. 4, the parameter has preset values which may be an upper and lower limit for the parameter such as coplanarity values. Therefore, in order to determine whether the system is properly calibrated, the readings are compared to the preset upper and lower limits to determine whether the readings are between the limits. In other words, when the system inspects a verification unit (100, 200) to provide plots such as those shown in FIG. 4, the plots (that is, whether the readings fall between the upper and lower limits such as shown in FIG. 4) indicate whether the system is properly calibrated. The parameters may include lead foot angle, device standoff, coplanarity, lateral spread and span, lead width, lead pitch, and lead gap.

The coplanarity values of the members may be determined as follows. First, the scanner of FIGS. 2 and 3 is used to scan the bottom surfaces of the members 54, 56, 58 of unit 50 of FIGS. 6, 7 to determine the three members 54 with the lowest surfaces when placed rightside up on a flat surface. The scanner then takes a top view scan of unit 50 and verifies that the center of gravity 60 of unit 50 (intersection of line connecting midpoints of sides 72, 74 and line connecting midpoints of side 76, 78 when viewed from top of unit 50) falls within the triangle formed by members 54. The lead inspection system of FIG. 3 then computes a seating plane from the lowest surfaces of members 54. The scanner readings on the lowest surfaces of members 56, 58 are then used for determining their coplanarity values.

Adding the step of scanning the verification units to the calibration procedure yields many benefits. Thus if any dimension of the unit is measured in the X or Y directions, such readings provide an indirect check on the accuracy of the precision tool. As noted above, the readings obtained using the verification unit provide direct checks on the proper implementation of the many calculation algorithms for calculating the above listed parameters as well as algorithms for other calculations such as the leadframe center line calculation. The lead inspection systems are used in production to inspect samples from lots or even the entire lots of packages and to provide readings in production. When compared to such production readings and to the readings obtained by using the system to inspect precision tools, the readings obtained using the system to inspect verification units 100, 200 will provide additional references for ascertaining whether the system is functioning properly. Since a large number of parameters can be verified in the same run, the source of problems such as drift can be more easily located and corrected. It is therefore desirable to use the verification unit intermittently after a predetermined number of lots or packages have been inspected to insure that proper calibration is maintained.

FIG. 11A is a top view of a universal verification unit to illustrate the preferred embodiment of the invention of this application. FIGS. 11B, 11C are side views of the unit of FIG. 11A viewed in two perpendicular directions and FIG. 11D shows the dimensions of one portion of the unit of FIG. 11B in the circle 11D in FIG. 11B. In contrast to verification unit 100 of FIG. 8A, the universal verification unit 300 of FIG. 11A has many more lead resembling members 303. Some of the lead resembling members, namely A, B, C, D, are structured to perform functions similar to members A, B, C, D of FIG. 8A described above.

The TI software for lead inspection would reject any package as an error if the width of any lead or the distance (lead gap) between any two adjacent leads is greater than 30 mils. For this reason, the width of and the gap between the lead resembling members are both set to be 27.56 mils as shown in FIG. 11A.

FIG. 12A is a top view of a shipping tray for carrying semiconductor packages in "live bug" positions. FIG. 12B is a cross-sectional view of a portion of the shipping tray of FIG. 12A taken along the line of 12B—12B in FIG. 12A.

FIG. 13 is a cross-sectional view of a portion of the universal verification unit 300 of FIG. 11A and of a portion of a representative shipping tray such as that shown in FIGS. 12A, 12B to illustrate the universal verification unit when positioned in the "live bug" lead inspection position. RVSI lead inspection systems employ a laser which is directed towards the top surfaces of the package and of the leads while the packages are sitting and held in shipping trays such as those shown in FIGS. 12A, 12B. Therefore, FIG. 13 shows the position of a portion of the verification unit 300 when it is sitting in a shipping tray 312.

FIG. 14 is a cross-sectional view of the portion of unit 300 of FIG. 13 but positioned in a "dead bug" position with the top portion of the package body held in an inspection nest 314. In TI lead inspection systems, semiconductor packages are turned upside down and held in inspection nest such as nest 314 whereupon the packages are observed in profile. To verify the calibration of the TI lead inspection systems, the universal verification unit is placed in the "dead bug" position with the top portion of the unit body supported by the inspection nest 314 shown in FIG. 14.

In reference to FIGS. 13 and 14, the TI lead inspection software is such that it rejects any package with a height in excess of 150 mils above the seating plane as a damaged part. Thus, if 320 is the seating plane of the unit 300, the height I of unit 300 should not exceed 150 mils. In the preferred embodiment, I has the value 147.64 mils.

For RVSI lead inspection systems, a laser light is provided above directed downwards toward the package or the verification unit and the lead resembling members, and the reflection from the top of the unit body 302 and the lead resembling members is detected. Specifically, the RVSI lead inspection system detects the reflection from the top surface 303a' of the foot 303a of the lead resembling member 303 shown in FIG. 13. RVSI lead inspection systems are set so that detection is possible only if surface 303a' is within 10 mils above or below the base plane 322. For this reason, the lead resembling member 303 is constructed differently from member 110 of FIG. 8D. More specifically, members 303 each has a foot 303a whereas members 110 do not.

The RVSI lead inspection system determines the seating plane from reflections from the top surfaces 303a' of the foot 303a of the lead resembling members 303 of unit 300, and then determine the positions of individual leads relative to the seating plane to detect lead misalignment. In general, the RVSI lead inspection systems are calibrated with respect to the base plane of unit 300, or the top surface 330 of the pockets of the shipping tray in FIGS. 12B and 13, since the bottom surface 322 of the unit body 302 is in contact with surface 330.

FIG. 14 illustrates a portion of the universal verification unit 300 placed in the "dead bug" position held within the nest 314 to similate the inspection environment of TI lead inspection systems. The light from the light surface in a TI system is perpendicular to the plane of the paper of FIG. 14 and is shown as arrow 340. The view of the scanner in the TI lead inspection system views such light on the other side of the unit 300 to obtain a side profile view of the unit. TI lead inspection systems are calibrated with respect to the surface 342 of the nest 314 in contact with a top surface 344 of the unit body. The side surface 346 of the top portion of the unit body has a slanting surface and a draft angle that causes the unit body 302 to fit into inspection nest 314.

Surface 303a' of foot portion 303a of all the lead resembling members 303 are at a uniform angle to the seating plane 320, such as at 5 degrees. This further facilitates the process by which RVSI lead inspection systems use reflections from surfaces 303a' to determine the seating plane. Since real leads of leads of packages are at an angle to the seating plane, the uniform angle of surfaces 303a' to the seating plane 320 yields additional information for very fine calibration of lead inspection systems.

TI lead inspection systems determine the seating plane from the bottom surface 303a" of the foot portion 303a whereas RVSI systems determine the seating plane from the top surface 303a' of the foot portions 303a. Preferably, the foot portions 303a of all the lead resembling members 303 have the same thickness so that the same universal verification unit 300 will enable both the TI and RVSI lead inspection systems to arrive at the same seating plane by looking at the top or the bottom surfaces of the foot portions 303a.

When unit 300 is held in the "live bug" position as shown in FIG. 13, the foot portion 303a of all the members should not extend far below the base plane 330 so as to touch the shipping tray 312. For this purpose, the sum of the distance between surface 303a' and the base plane 322 (D) and the thickness of the foot portion (E) should not exceed the thickness (G) of the pedestal of the tray pocket 312. Commonly used shipping trays include AMS trays and Shinon trays which have pedestals that are 105 mils and 82 mils in thickness (G in FIG. 13) respectively. Therefore, the sum of D and E should not exceed 82 mils, the smaller of the two thicknesses.

In reference to FIGS. 11A, 11B, the universal verification unit 300 of this invention includes a unit body 302 resembling a package body where the unit body is a plate having a top surface 344, and a bottom surface 322 that defines a base plane, and lead-resembling elongated members 303 distributed around the unit body. Each member has a foot portion 303a resembling a lead foot. As in unit 100 described above, the foot portions of three members of bottom surfaces that extend furthest below the base plane, so that the lowest points of such bottom surfaces of the foot portions define a seating plane. Like unit 100, such members are at such locations around the unit body that when the test unit is placed on top of the flat surface, such lowest points will contact the flat surface. As explained above, the seating plane is less than about 150 mils from the top surface 344 of the unit body and the foot portions of the members of top surfaces that are less than 10 mils from the base plane 322. The thickness of the foot portions 303a is in the range of 17 to 20 mils.

As shown in FIGS. 12B, 13, the shipping tray pocket has a raised portion or ridge 362 for nesting the package body of semiconductor packages. To accommodate such ridge, the lead resembling member 303 has a notch 364 underneath as shown in FIG. 13.

The range of possible values of the quantities A–I are listed below:

| | |
|---|---|
| A | 0.00–66.14 |
| B | 5.00–92.56 |
| C | 30.00–36.00 |
| D | 0.00–20.00 |
| E | 5.00–82.00 |
| F | 0.00–82.00 |
| G | 82.00 |
| H | 35.00–143.27 |
| I | 150.00 |

However, because of the dimensions of existing shipping trays and nests, it is not possible for the quantities A–I to take on the full range of values listed above. Instead, the range of practical measures constrained by tray and nest dimensions are as follows:

| | |
|---|---|
| A | 53.00–66.14 |
| B | 26.42–40.27 |
| C | 30.00–36.00 |
| D | 0.00–20.00 |
| E | 5.00–82.00 |
| F | 0.00–77.00 |
| G | 82.00 |
| H | 35.00–130.13 |
| I | 150.00 |

In the preferred embodiment, the actual value s of the quantities A–I are listed below:

| | |
|---|---|
| A | 66.14 |
| B | 21.30 |
| C | 35.83 |
| D | 7.09 |
| E | 17.28 |
| F | 57.63 |
| G | 82.00 |
| H | 64.22 |
| I | 147.64 |
| J | 1227.70 |
| K | 1097.70 |
| L | 1074.80 |
| M | 1074.80 |
| N | 1086.61 |
| O | 1147.71 |

The quantities J–O are the dimensions as indicated in FIG. 15.

The process for making the universal verification unit 300 will now be described in reference to FIGS. 16A–16F. The starting material of the unit is a block of heat treated 440 stainless steel 400 in FIG. 16A. Heat treated stainless steel offers the required hardness properties necessary to assure that the unit will be robust throughout extended, frequent usage. As shown in FIG. 16B, a mineral cutting wheel 402 is used to cut slots along the four sides of the package body to form the four rows of lead resembling members with no gaps between adjacent leads at this point, and a unit body 302. The cutting wheel cuts the slots above and below the shoulders of each of the four rows of leads parallel to the edge of the unit body 302.

With the exception of lead resembling members A, B, C and D in FIG. 11A, the bottom and top surfaces of the foot portions 303a of each member are created by a grinding process along the foot to achieve a specified finished angle to the seating plane. The 10 degree draft angle of the slanting side surface of the unit body, such as surface 346 in FIG. 14, is also created from grinding to help seat the unit body into a nest as shown in FIG. 14.

Since members A, B and D extend 2 mils below the remaining members in the "live bug" position and member C extends 2 mils above the seating plane, they must be machined using a separate process. Because of space constraints, foot portions of these four members are individually mill finished rather than ground to insure that the neighboring lead resembling members are not affected. The gaps between members are then cut one by one with a cutting wheel 404, thereby creating each of the individual eighty lead resembling members 303.

Since two separate processes are used to create the differences in height of the foot portions of members A, B, C, D versus the remaining members, two different finishes exist on the surfaces of the foot portions of the unit of the stage. Since the dimensional measurement capabilities of some lead scanners are based on the reflectivity characteristics of the universal verification unit, it is desirable to have a single and unique finish. Thus, in order to achieve a uniform finish throughout the part, the unit is "bead blasted" using medium coarseness means as a finishing step shown in FIG. 16D. Since it is desirable to avoid changing the dimensions of the individual lead resembling members after they are formed by cutting, it is desirable to bead blast the unit after the four rows of undivided members are formed as shown in FIG. 16C but before the individual lead resembling members are formed by cutting as shown in FIG. 16E.

Incorporated by reference is an article entitled "Characterization and Control of PLCC and MQFP Lead Inspection Systems," by Scott A. Erjavic, which is attached hereto as Appendix. The article has been published in the 1991 Proceedings of the International Test Conference.

While the invention has been described by reference to various embodiments, it will be understood that various modifications may be made without departing from the scope of the invention which is to be limited only by the appended claims.

What is claimed is:

1. A device for testing the calibration of a system for inspecting leads of an electronic package comprising a package body and a leadframe having leads, said leads each having a lead foot, said leads being formed from a material having a thickness and malleability such that each lead is able to be bent and shaped by application of at least a minimal threshold level of force exerted upon the lead, wherein for the purpose of proper alignment and connection to corresponding connection means, a limit of at least one predetermined position control parameter of said leads is defined relative to the leadframe or the package body, wherein when the actual positions of the leads are such that said limit is exceeded, said leads are not in proper alignment for connection to the connection means, said system inspecting said leads to provide readings to indicate whether the actual positions of the leads are such that said limit of at least one predetermined position control parameter is exceeded, said device being a test unit, said test unit comprising:

a body resembling said package body, said body being a plate having a top and a bottom surface, said bottom surface defining a base plane; and lead-resembling elongated members distributed around the body, each member having a foot portion resembling a lead foot, said members being so located and having certain dimensions which differ from designed dimensions of the leads of the electronic package but which bear predetermined spacial and dimensional relationships to said designed dimensions of the leads, wherein said members are sufficiently robust so as to prevent said certain dimensions from changing when said minimal threshold level of force is exerted upon said members, wherein the foot portions of three members have bottom surfaces that extend furthest below the base plane, the lowest points of such bottom surfaces of the foot portions defining a seating plane, said three members being at such locations around the body that when the test unit is placed on top of a flat surface, said lowest points will contact said flat surface, wherein said seating plane is less than about 150 mils from the top surface of the body and wherein the foot portions of the members have top surfaces that are less than 10 mils from the base plane.

2. The device of claim 1, wherein all of the foot portions of the members have substantially the same thickness.

3. The device of claim 2, wherein the thickness is in the range of 17 mils to 20 mils.

4. The device of claim 1, wherein said top surfaces of the foot portions are at substantially the same angle to the base plane.

5. The device of claim 1, wherein the lowest points of the bottom surfaces of the foot portions do not extend more than about 82 mils from the base plane.

6. The device of claim 1, wherein each of the members has a width less than about 30 mils.

7. The device of claim 1, wherein the members are distributed around the body with each member having at least one adjacent member so that the spacing between any two adjacent members is less than about 30 mils.

8. The device of claim 1, wherein the members each defines a notch in its under side to accommodate a ridge of a shipping tray pocket.

9. A device for testing the calibration of any one of a plurality of systems for inspecting leads of an electronic package comprising a package body and a leadframe having leads, said leads being formed from a material having a thickness and malleablility such that each lead is able to be bent and shaped by application of at least a minimal threshold level of force exerted upon the lead, each of said systems including hardware specifically configured to inspect leads of a desired leadframe type, said leads each having a lead foot and a lead shoulder, wherein for the purpose of proper alignment and connection to corresponding connection means, a limit of at least one predetermined position control parameter of said leads is defined relative to the leadframe or the package body, wherein when the actual positions of the leads are such that said limit is exceeded, said leads are not in proper alignment for connection to the connection means, each of said systems inspecting said leads to provide readings to indicate whether the actual positions of the leads are such that said limit of at least one predetermined position control parameter is exceeded, said device comprising:

universal testing means for testing the calibration of each of said plurality of lead inspection systems without the need to physically alter the specific hardware configuration of any one of said systems in order to subsequently inspect leads of said desired type of leadframe after the calibration of said one system has been tested using said universal testing means, said universal testing means comprising:
  a body resembling said package body, said body being a plate having a top and a bottom surface, said bottom surface defining a base plane; and
  lead-resembling elongated members distributed around the body, each member having a foot portion resembling a lead foot, said members being so located and having certain dimensions which differ from designed dimensions of the leads of the electronic package but which bear predetermined spacial and dimensional relationships to said designed dimensions of the leads, wherein said members are sufficiently robust so as to prevent said certain dimensions from changing when said minimal threshold level of force is exerted upon said members.

10. The device of claim 9 wherein the foot portions of three members have bottom surfaces that extend furthest below the base plane, the lowest points of such bottom surfaces of the foot portions defining a seating plane, said three members being at such locations around the body that when the test unit means is placed on top of a flat surface, said lowest points will contact said flat surface, and wherein said seating plane is less than about 150 mils from the top surface of the body and wherein the foot portions of the members have top surfaces that are less than 10 mils from the base plane.

11. The device of claim 9 wherein said the members each defines a notch in its under side to accommodate a ridge of a shipping tray pocket.

12. The device of claim 9 wherein each of said members includes a shoulder portion resembling a lead shoulder.

13. The device of claim 9 wherein said universal test means is devoid of a semiconductor die.

14. The device of claim 9 wherein said members are comprised of a material having hardness properties at least equal to that of heat treated stainless steel.

* * * * *